US012660412B2

(12) United States Patent
Zhang et al.

(10) Patent No.: US 12,660,412 B2
(45) Date of Patent: Jun. 16, 2026

(54) LIGHT-EMITTING DEVICE AND DISPLAY PANEL

(71) Applicant: BOE Technology Group Co., Ltd., Beijing (CN)

(72) Inventors: Shuaifeng Zhang, Beijing (CN); Siqi Wang, Beijing (CN); Haiyan Sun, Beijing (CN); Xiaojin Zhang, Beijing (CN); Dan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/857,160

(22) PCT Filed: Jan. 2, 2024

(86) PCT No.: PCT/CN2024/070035
§ 371 (c)(1),
(2) Date: Oct. 15, 2024

(87) PCT Pub. No.: WO2024/149104
PCT Pub. Date: Jul. 18, 2024

(65) Prior Publication Data
US 2025/0275356 A1 Aug. 28, 2025

(30) Foreign Application Priority Data
Jan. 13, 2023 (CN) .......................... 202310068341.1

(51) Int. Cl.
*H10K 50/852* (2023.01)
*G02F 1/1335* (2006.01)
(Continued)

(52) U.S. Cl.
CPC ..... *H10K 50/852* (2023.02); *G02F 1/133528* (2013.01); *G02F 1/133603* (2013.01);
(Continued)

(58) Field of Classification Search
CPC ...... H10K 50/852; H10K 59/50; H10K 50/19; G02F 1/133528
See application file for complete search history.

(56) References Cited

U.S. PATENT DOCUMENTS 5,478,658 A 12/1995 Dodabalapur et al.
6,546,038 B1 4/2003 Mizuno
(Continued)

FOREIGN PATENT DOCUMENTS

CN 1728413 A 2/2006
CN 107768532 A 3/2018
(Continued)

OTHER PUBLICATIONS

CN202310068341.1 first office action dated Sep. 11, 2025.

*Primary Examiner* — Lucy P Chien
(74) *Attorney, Agent, or Firm* — IPro, PLLC

(57) ABSTRACT
The present disclosure relates to the technical field of display, and provides a light-emitting device and a display panel. The light-emitting device comprises a first electrode, a second electrode, a plurality of light-emitting units arranged between the first electrode and the second electrode, and charge separation and generation units arranged between every two adjacent light-emitting units. The light-emitting center of each light-emitting unit is located at an antinode of a resonance wave of a resonant microcavity formed between the first electrode and the second electrode.

14 Claims, 5 Drawing Sheets

(51) Int. Cl.

| | | |
|---|---|---|
| *G02F 1/13357* | (2006.01) | |
| *H10K 50/19* | (2023.01) | |
| *H10K 59/35* | (2023.01) | |
| *H10K 59/50* | (2023.01) | |

(52) U.S. Cl.

CPC ............. *H10K 50/19* (2023.02); *H10K 59/50* (2023.02); *H10K 59/35* (2023.02)

(56) References Cited

U.S. PATENT DOCUMENTS

| | | | |
|---|---|---|---|
| 2011/0175123 A1 * | 7/2011 | Koh ..................... | H10K 50/868 |
| | | | 257/E51.019 |
| 2015/0085224 A1 * | 3/2015 | Hsu ........................ | H10K 59/50 |
| | | | 349/98 |
| 2018/0040842 A1 | 2/2018 | Wu | |
| 2019/0165294 A1 | 5/2019 | Forrest et al. | |
| 2020/0035758 A1 | 1/2020 | Kang et al. | |

FOREIGN PATENT DOCUMENTS

| | | | | | |
|---|---|---|---|---|---|
| CN | 108987603 A | * | 12/2018 | ........... | H10K 50/805 |
| CN | 109004101 A | * | 12/2018 | ............. | H10K 50/85 |
| CN | 112420974 A | | 2/2021 | | |
| CN | 212695182 U | | 3/2021 | | |
| CN | 108987603 B | * | 7/2021 | ........... | H10K 50/852 |
| CN | 114551750 A | | 5/2022 | | |
| CN | 115497983 A | | 12/2022 | | |
| CN | 116249380 A | | 6/2023 | | |
| JP | 2014045015 A | | 3/2014 | | |
| JP | 2014225414 A | | 12/2014 | | |
| TW | 201345011 A | | 11/2013 | | |
| WO | WO-2019235233 A1 | * | 12/2019 | ............... | G02F 1/13 |

* cited by examiner

LIGHT-EMITTING DEVICE AND DISPLAY PANEL

The present application is a national stage of international application No. PCT/CN2024/070035, filed on Jan. 2, 2024, which claims priority to Chinese application No. 202310068341.1, filed on Jan. 13, 2023, the entire contents of both of which are incorporated herein by reference.

TECHNICAL FIELD

The present disclosure belongs to the field of display technologies, and particularly relates to a light-emitting device and a display panel.

BACKGROUND ART

With the development of display technologies, people's requirements for display devices are getting higher and higher. Compared with mature liquid crystal displays (LCD), an organic electroluminescent device (OLED) display has the advantages of high color saturation, low driving voltages, wide viewing angle display, flexibility, fast response speeds, simple manufacturing process, etc., thus gradually replacing the mainstream position of LCD displays.

A tandem OLED light-emitting device is a device that connects a plurality of layers of light-emitting units in a light-emitting device in series through a charge generation layer, and is controlled by only one external power source. At the same voltage, compared with a single-layer OLED light-emitting device, a tandem OLED light-emitting device has higher luminous brightness and current efficiency. The luminous brightness and current efficiency increase exponentially with the increase in the number of tandem light-emitting units. At the same current density, the tandem OLED has higher brightness, higher efficiency, and longer life than a single-layer OLED.

SUMMARY OF THE INVENTION

The present disclosure provides a light-emitting device and a display panel.

In a first aspect, the technical solution adopted to solve the technical problem of the present disclosure is a light-emitting device, including a first electrode, a second electrode, a plurality of light-emitting units arranged between the first electrode and the second electrode, and a charge separating generating unit arranged between adjacent light-emitting units, wherein a light-emitting center of the light-emitting unit is located at an antinode point of a resonance wave of a resonant microcavity formed between the first electrode and the second electrode.

In some embodiments, a cholesteric liquid crystal layer is arranged on a side of the second electrode away from the first electrode.

In some embodiments, a polarizer is arranged on a side of the cholesteric liquid crystal layer away from the second electrode.

In some embodiments, a distance between light-emitting centers of two adjacent light emitting units is the same as a distance between two adjacent antinode points of the resonance wave.

In some embodiments, a cavity length of the resonant microcavity formed between the first electrode and the second electrode is k/2 times a wavelength of emitted light of the light-emitting device, where k is an integer.

In some embodiments, the plurality of light emitting units include two light emitting units, referred to as a first light emitting unit and a second light emitting unit; and a distance from a light-emitting center of the first light-emitting unit to a side of the first electrode close to the second electrode is $(2u+1)/4$ times the wavelength of the emitted light of the light-emitting device, and a distance from a light-emitting center of the second light-emitting unit to the side of the first electrode close to the second electrode is $(2v+1)/4$ times the wavelength of the emitted light of the light-emitting device, where u and v are both integers, and u is less than v, and u and v are both less than $k-1/2$.

In some embodiments, the light-emitting device is a red light-emitting device; and an emission peak of an emission spectrum of the red light-emitting device is between 610 nm and 690 nm; and a half-peak width of the emission spectrum of the red light-emitting device is between 20 nm and 50 nm.

In some embodiments, the light-emitting device is a green light-emitting device; and an emission peak of an emission spectrum of the green light-emitting device is between 500 nm and 550 nm, and a half-peak width of the emission spectrum of the green light-emitting device is between 15 nm and 35 nm.

In some embodiments, the light-emitting device is a blue light-emitting device; and an emission peak of an emission spectrum of the blue light-emitting device is between 440 nm and 470 nm; and a half-peak width of the emission spectrum of the blue light-emitting device is between 10 nm and 25 nm.

In some embodiments, the light-emitting device is a red light-emitting device; and an emission peak of an emission spectrum of the cholesteric liquid crystal layer is between $\lambda r-8$ nm and $\lambda r+8$ nm, wherein $\lambda r$ is an emission peak of an emission spectrum of the red light-emitting device; and a half-peak width of the emission spectrum of the cholesteric liquid crystal layer is between 20 nm and 70 nm.

In some embodiments, the light-emitting device is a green light-emitting device; and an emission peak of an emission spectrum of the cholesteric liquid crystal layer is between $\lambda g-5$ nm and $\lambda g+5$ nm, wherein $\lambda g$ is an emission peak of an emission spectrum of the green light-emitting device; and a half-peak width of the emission spectrum of the cholesteric liquid crystal layer is between 20 nm and 50 nm.

In some embodiments, the light-emitting device is a blue light-emitting device; and an emission peak of an emission spectrum of the cholesteric liquid crystal layer is between $\lambda b-2$ nm and $\lambda b+2$ nm, wherein $\lambda b$ is an emission peak of an emission spectrum of the blue light-emitting device; and a half-peak width of the emission spectrum of the cholesteric liquid crystal layer is between 20 nm and 40 nm.

In some embodiments, the light-emitting device is a red light-emitting device; and a transmittance of the second electrode is between 45% and 50%; or, the light-emitting device is a green light-emitting device; and a transmittance of the second electrode is between 55% and 60%; or, the light-emitting device is a blue light-emitting device, and a transmittance of the second electrode is between 65% and 70%.

In some embodiments, an encapsulation layer is arranged on a side of the cholesteric liquid crystal layer close to the second electrode; and the encapsulation layer includes a first inorganic layer and a second inorganic layer, and an organic layer arranged between the first inorganic layer and the second inorganic layer;

a light extraction layer is arranged on a side of the encapsulation layer close to the second electrode;

a refractive index of the second electrode is greater than a refractive index of the light extraction layer; the refractive index of the light extraction layer is less than a refractive index of the first inorganic layer; the refractive index of the first inorganic layer is greater than a refractive index of the organic layer; and the refractive index of the organic layer is less than a refractive index of the second inorganic layer.

In a second aspect, an embodiment of the present disclosure further provides a display panel, which includes a light-emitting device as described in any one of the above embodiments.

Figure 1:
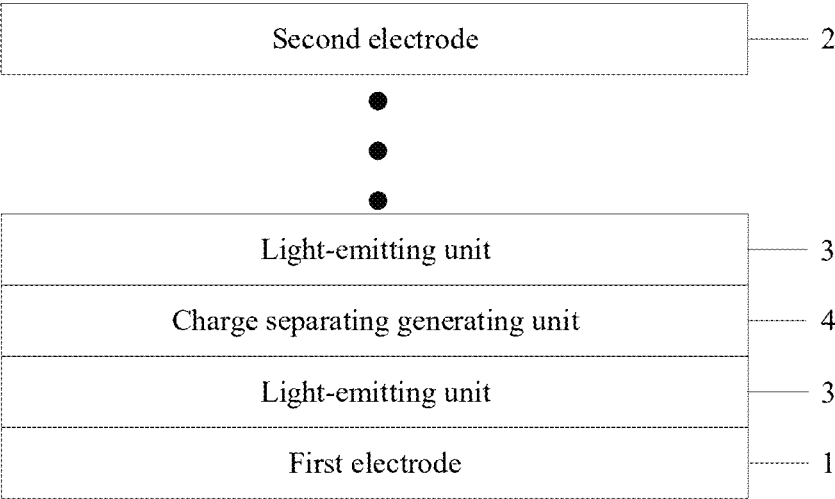
FIG. 1 is a schematic diagram of a light-emitting device according to an embodiment of the present disclosure.

The figures are marked as follows: 1. first electrode; 2. second electrode; 3. light-emitting unit; 4. charge separating generating unit; CLC, cholesteric liquid crystal layer; POL, polarizer; CPL, light extraction layer; 5. encapsulation layer; CVD1, first inorganic layer; CVD2, second inorganic layer, and IJP, organic layer.

DETAILED DESCRIPTION

In order to make the objectives, technical solutions and advantages of the embodiments of the present disclosure clearer, the technical solutions in the embodiments of the present disclosure will be clearly and completely described below in conjunction with the drawings in the embodiments of the present disclosure. Obviously, the described embodiments are only part of the embodiments of the present disclosure, rather than all of the embodiments. The components of the embodiments of the present disclosure generally described and shown in the drawings here can be arranged and designed in various different configurations. Therefore, the following detailed description of the embodiments of the present disclosure provided in the drawings is not intended to limit the scope of the present disclosure for protection, but merely represents the selected embodiments of the present disclosure. Based on the embodiments of the present disclosure, all other embodiments obtained by those skilled in the art without making creative work belong to the scope of protection of the present disclosure.

Unless otherwise defined, the technical terms or scientific terms used in the present disclosure should be understood by people with ordinary skills in the field to which the present disclosure belongs. The "first", "second" and similar words used in the present disclosure do not indicate any order, quantity or importance, but are only used to distinguish different components. Similarly, similar words such as "a", "an" or "the" do not indicate quantity restrictions, but indicate that there is at least one. Similar words such as "include" or "comprise" mean that the elements or objects appearing before the word cover the elements or objects listed after the word and their equivalents, without excluding other elements or objects. Similar words such as "connect" or "connected" are not limited to physical or mechanical connections, but can include electrical connections, whether direct or indirect. "Up", "down", "left", "right" and the like are only used to indicate relative positional relationships. When the absolute position of the described object changes, the relative positional relationship may also change accordingly.

In the present disclosure, "a plurality of or several" refers to two or more. "And/or" describes the association relationship of associated objects, indicating that three relationships may exist. For example, A and/or B can mean: A exists alone, A and B exist at the same time, and B exists alone. The character "/" generally indicates that the associated objects are in an "or" relationship.

In related technologies, based on the optimization and iteration of light-emitting materials of OLED devices, both phosphorescent materials and thermally activated delayed fluorescent materials can achieve an internal quantum efficiency of 100%. However, due to the losses of the substrate, waveguide, and surface plasma mode inside the device caused by the multi-layer OLED organic layer and metal electrodes, the theoretical upper limit of the external quantum efficiency (EQE) of OLED devices is 20%, while the theoretical EQE of the tandem OLED device with dual light-emitting units is less than 40%. In addition, in order to resist ambient light reflection and improve the user experience, OLED devices often introduce polarizers, and the introduction of polarizers will cause the outgoing light to attenuate by more than half again, reducing the optical gain and efficiency of the tandem OLED device.

Based on this, an embodiment of the present disclosure provides a light-emitting device, which substantially eliminates one or more of the problems caused by the limitations and defects of the related art. Specifically, the light-emitting device includes a first electrode, a second electrode, a plurality of light-emitting units arranged between the first electrode and the second electrode, and a charge separating generating unit arranged between adjacent light-emitting units, wherein a light-emitting center of the light-emitting unit is located at an antinode point of a resonance wave of a resonant microcavity formed between the first electrode and the second electrode.

The light-emitting device according to the embodiment of the present disclosure is specifically a tandem light-emitting device (such as a tandem OLED device), that is, a plurality of light-emitting units is connected in series and controlled only by one external power supply. The light-emitting center of the light-emitting unit is arranged near the antinode point of the resonant wave of the resonant microcavity formed between the first electrode and the second electrode, and the resonant microcavity effect inside the tandem OLED device is used to effectively extract the internal light of the OLED device to achieve significant enhancement of the electro-optical performance of the entire tandem OLED device.

The specific structure of the light-emitting device according to the embodiment of the present disclosure will be described in detail below.

FIG. 1 is a schematic diagram of a light-emitting device according to an embodiment of the present disclosure. As shown in FIG. 1, the light-emitting device includes a first electrode 1, a second electrode 2, a plurality of light-emitting units 3 arranged between the first electrode 1 and the second electrode 2, and a charge separating generating unit 4 arranged between adjacent light-emitting units 3. Here, a plurality of light-emitting units 3 is connected in series and controlled by only one external power supply to realize a tandem light-emitting device. One of the first electrode 1 and the second electrode 2 may be an anode, and the other may be a cathode.

Optionally, a light-emitting center of the light-emitting unit 3 is located at an antinode point of a resonance wave of a resonant microcavity formed between the first electrode 1 and the second electrode 2. It should be noted that emitted light of the light-emitting unit 3 oscillates in the resonant microcavity formed between the first electrode 1 and the second electrode 2, so as to continuously interact with excited state particles to produce stimulated emission. The emitted light of the light-emitting unit 3 generates a resonance wave under the action of the resonant microcavity, and the resonance wave has a plurality of antinode points, in which the antinode point is also the point with the largest amplitude. As shown in FIG. 1, the light-emitting center A of the light-emitting unit 3 is, for example, a central position point of the light-emitting unit 3, or a central position point of the light-emitting layer. The position point of the light-emitting center A of the light-emitting unit 3 in the resonant microcavity formed between the first electrode 1 and the second electrode 2 is located near the antinode point of the resonance wave of the resonant microcavity.

Figure 2:
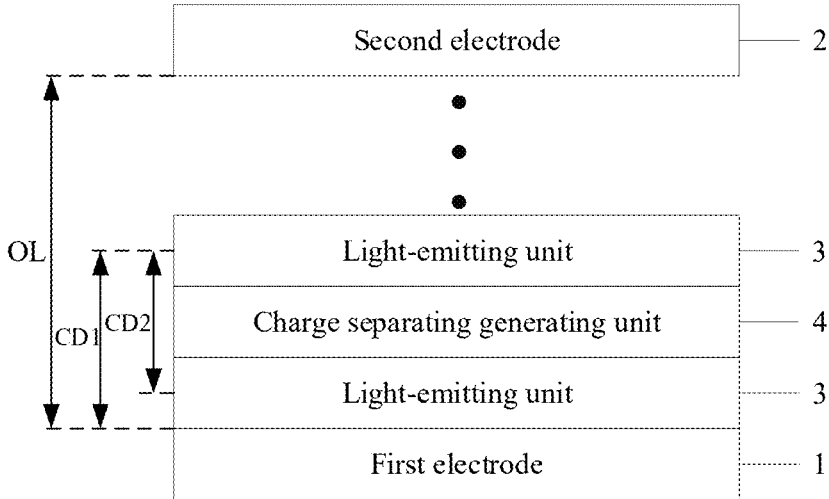
FIG. 2 is a schematic diagram of a positional relationship of various film layer structures according to an embodiment of the present disclosure.

In some embodiments, a cavity length of the resonant microcavity formed between the first electrode 1 and the second electrode 2 is k/2 times a wavelength of emitted light of the light-emitting device, where k is an integer. FIG. 2 is a schematic diagram of a positional relationship of various film layer structures according to the embodiment of the present disclosure. As shown in FIG. 2, OL represents the cavity length of the resonant microcavity formed between the first electrode 1 and the second electrode 2, that is, a distance between a side of the first electrode 1 close to the second electrode 2 and a side of the second electrode 2 close to the first electrode 1; and $\lambda$ represents the wavelength of the emitted light of the light-emitting device. In one case, if the light-emitting device according to the present disclosure is a bottom emission device, the emitted light of the light-emitting device can be understood as light emitted from the anode. In another case, if the light-emitting device according to the present disclosure is a top emission device, the emitted light of the light-emitting device can be understood as light emitted from the cathode. Specifically, the cavity length OL of the resonant microcavity=$\lambda \times k/2$.

In some embodiments, the plurality of light-emitting units 3 includes two light-emitting units 3, recorded as a first light-emitting unit 3 and a second light-emitting unit 3. A distance from a light-emitting center of the first light-emitting unit 3 to a side of the first electrode 1 close to the second electrode 2 is $(2u+1)/4$ times the wavelength of the emitted light of the light-emitting device, and a distance from a light-emitting center of the second light-emitting unit 3 to the side of the first electrode 1 close to the second electrode 2 is $(2v+1)/4$ times the wavelength of the emitted light of the light-emitting device, where u and v are both integers, and u is less than v, and u and v are both less than k−1/2.

Continuing as shown in FIG. 2, CD1 represents the distance from the light-emitting center of the first light-emitting unit 3 to the side of the first electrode 1 close to the second electrode 2, and CD2 represents the distance from the light-emitting center of the second light-emitting unit 3 to the side of the first electrode 1 close to the second electrode 2. CD1=$\lambda \times (2u+1)/4$, and CD2=$\lambda \times (2v+1)/4$. Here, orthographic projections of the first light-emitting unit 3 and the second light-emitting unit 3 on the substrate overlap, and the second light-emitting unit 3 is closer to the second electrode 2 than the first light-emitting unit 3, so u is less than v. In addition, CD1 and CD2 also need to meet the requirement of being less than the cavity length OL of the resonant microcavity, so u and v are both less than k−1/2.

In some embodiments, a distance between light-emitting centers of two adjacent light emitting units 3 is the same as a distance between two adjacent antinode points of the resonance wave.

Continuing as shown in FIG. 2, the light-emitting center A1 of the first light-emitting unit 3 and the light-emitting center A2 of the second light-emitting unit 3 are respectively located near two adjacent antinodes of the resonance wave. For example, the light-emitting center A1 of the first light-emitting unit 3 is located near a first antinode of the resonance wave, and the light-emitting center A2 of the second light-emitting unit 3 is located near a second antinode of the resonance wave. Alternatively, the light-emitting center A1 of the first light-emitting unit 3 is located near the second antinode of the resonance wave, and the light-emitting center A2 of the second light-emitting unit 3 is located near a third antinode of the resonance wave. The light-emitting center A1 of the first light-emitting unit 3 is located near the third antinode of the resonance wave, and the light-emitting center A2 of the second light-emitting unit 3 is located near a fourth antinode of the resonance wave. For example, v=u+1, when u=0, v=1, CD1=$\lambda \times 1/4$, A1 is located near the first antinode of the resonance wave; and CD2=$\lambda \times 3/4$, A2 is located near the second antinode of the resonance wave. Similarly, when u=1, v=2, CD1=$\lambda > 3/4$, A1 is located near the second antinode of the resonance wave; and CD2=$\lambda \times 5/4$, A2 is located near the third antinode of the resonance wave. When u=2, v=3, CD1=$\lambda \times 5/4$, A1 is located near the third antinode of the resonance wave; and CD2=$\lambda \times 7/4$, A2 is located near the fourth antinode of the resonance wave. The distance between the light-emitting centers of two adjacent light-emitting units 3, i.e., CD2−CD1=$\lambda/2$, is the same as the distance between two adjacent antinodes of the resonance wave.

As mentioned above, on the premise that the cavity length of the resonant microcavity formed between the first electrode 1 and the second electrode 2 is k/2 times the wavelength of the emitted light of the light-emitting device, the position points of the light-emitting centers A of the two adjacent light-emitting units 3 in the resonant microcavity are located near the adjacent antinodes of the resonant wave of the resonant microcavity, which can improve the effective extraction of the internal light of the light-emitting device, that is, increase the intensity of the light emitted from the second electrode 2, thereby realizing significant enhancement of the optical gain of the light-emitting device and improving the efficiency of the light-emitting device.

Figure 3:
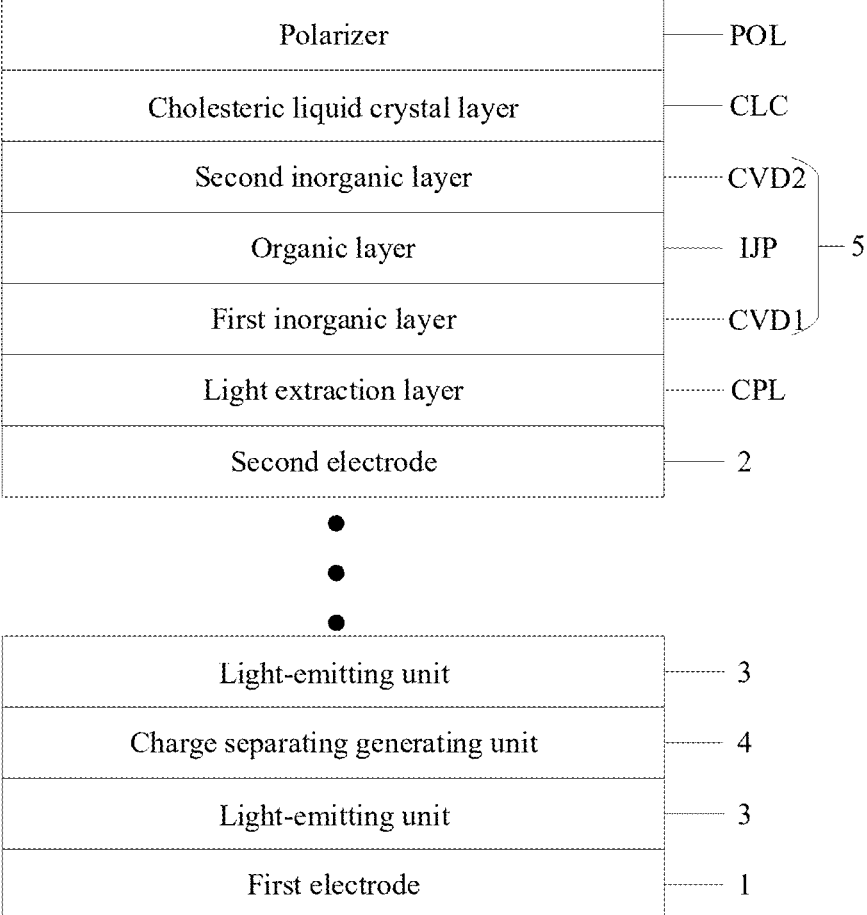
FIG. 3 is a schematic diagram of a specific structure of a light-emitting device according to an embodiment of the present disclosure.

In some embodiments, FIG. 3 is a schematic diagram of a specific structure of a light-emitting device according to an embodiment of the present disclosure. As shown in FIG. 3, a cholesteric liquid crystal layer (CLC) is arranged on a side of the second electrode 2 away from the first electrode 1. The material properties of the cholesteric liquid crystal layer (CLC) are utilized to enhance the optical gain and improve the efficiency of the light-emitting device. It should be noted that the material properties of the cholesteric liquid crystal layer (CLC) are specifically: it can selectively reflect circularly polarized light of a certain rotation direction in a specific wavelength range, and transmit circularly polarized light outside the reflection wavelength region with the opposite rotation direction and the same rotation direction.

For example, the outgoing light from the second electrode 2 side includes two types of circularly polarized light with different rotational directions, such as left-handed and right-handed. The outgoing light from the second electrode 2 side passes through the cholesteric liquid crystal layer (CLC). The cholesteric liquid crystal layer (CLC) reflects circularly polarized light in a specific wavelength range and a certain rotation direction, such as left-handed circularly polarized light, and simultaneously transmits right-handed circularly polarized light and left-handed circularly polarized light outside the reflection wavelength range. The reflected left-handed circularly polarized light can change its direction through reflection by the second electrode 2, that is, left-handed to right-handed. At this time, the right-handed circularly polarized light reflected by the second electrode 2 emits.

The embodiment of the present disclosure can significantly enhance the electro-optical performance of the entire tandem OLED device through the synergistic effect of the microcavity effect inside the tandem light-emitting device and the optical gain of the cholesteric liquid crystal layer (CLC).

In some embodiments, as shown in FIG. 3, a polarizer (POL) is arranged on a side of the cholesteric liquid crystal layer (CLC) away from the second electrode 2. The polarizer (POL) has a material property of transmitting circularly polarized light of a certain rotation direction and absorbing circularly polarized light of an opposite rotation direction. In the embodiment of the present disclosure, based on the material properties of the polarizer (POL) and the cholesteric liquid crystal layer (CLC), the transmission rotation direction of the polarizer (POL) is set opposite to the reflection rotation direction of the cholesteric liquid crystal layer (CLC).

Continuing with the above example, the polarizer (POL) transmits right-handed circularly polarized light and absorbs left-handed circularly polarized light. The right-handed circularly polarized light emitted from the second electrode 2 side is transmitted through the cholesteric liquid crystal layer (CLC) and finally transmitted from the polarizer (POL). Regarding the left-handed circularly polarized light in the reflection wavelength region and the left-handed circularly polarized light outside the reflection wavelength region emitted from the second electrode 2 side, the cholesteric liquid crystal layer (CLC) reflects the left-handed circularly polarized light in the reflection wavelength region and transmits the left-handed circularly polarized light outside the reflection wavelength region. The transmitted left-handed circularly polarized light outside the reflection wavelength region is absorbed, and the reflected left-handed circularly polarized light in the reflection wavelength region changes its rotation direction through the second electrode 2 and becomes right-handed circularly polarized light, which is then transmitted through the cholesteric liquid crystal layer (CLC) and then emitted from the polarizer (POL).

The added cholesteric liquid crystal layer (CLC) is combined with the polarizer (POL), which can further improve the extraction efficiency of the internal light of the light-emitting device on the basis of the above-mentioned microcavity effect, thereby improving the efficiency of the light-emitting device.

In the embodiment of the present disclosure, the light-emitting device may be one of a red light-emitting device, a green light-emitting device and a blue light-emitting device. The light-emitting devices of different colors are described in detail below.

In some embodiments, the light-emitting device is a red light-emitting device. An emission peak of an emission spectrum of the red light-emitting device is between 610 nm and 690 nm; and a half-peak width of the emission spectrum of the red light-emitting device is between 20 nm and 50 nm. Here, the half-peak width of the emission spectrum of the red light-emitting device is only between 20 nm and 50 nm, and a higher color gamut can be obtained using the red light-emitting device.

It should be noted that, in the embodiments of the present disclosure, "the emission spectrum of the light-emitting device" can be understood as the spectrum of light emitted from the second electrode 2 side.

In some embodiments, the light-emitting device is a green light-emitting device. An emission peak of an emission spectrum of the green light-emitting device is between 500 nm and 550 nm; and a half-peak width of the emission spectrum of the green light-emitting device is between 15 nm and 35 nm. Here, the half-peak width of the emission spectrum of the green light-emitting device is only between 15 nm and 35 nm, and a higher color gamut can be obtained by using the green light-emitting device.

In some embodiments, the light-emitting device is a blue light-emitting device. An emission peak of an emission spectrum of the blue light-emitting device is between 440 nm and 470 nm; and a half-peak width of the emission spectrum of the blue light-emitting device is between 10 nm and 25 nm. Here, the half-peak width of the emission spectrum of the blue light-emitting device is only between 10 nm and 25 nm, and a higher color gamut can be obtained by using the blue light-emitting device.

In some embodiments, the light-emitting device is a red light-emitting device. An emission peak of an emission spectrum of the cholesteric liquid crystal layer (CLC) is between $\lambda r-8$ nm and $\lambda r+8$ nm, in which $\lambda r$ is an emission peak of an emission spectrum of the red light-emitting device, that is, $\lambda r$ is between 610 nm and 690 nm. Here, setting the emission peak of the emission spectrum of the cholesteric liquid crystal layer (CLC) between $\lambda r-8$ nm and $\lambda r+8$ nm can approximately characterize that the emission peak of the emission spectrum of the cholesteric liquid crystal layer (CLC) is similar to the emission peak of the emission spectrum of the red light-emitting device, or characterize that the emission spectrum of the cholesteric liquid crystal layer (CLC) is similar to the emission spectrum of the red light-emitting device, so that the light emitted from the second electrode 2 side is finally transmitted from the cholesteric liquid crystal layer (CLC) as much as possible, thereby promoting the effective extraction of light.

A half-peak width of the emission spectrum of the cholesteric liquid crystal layer (CLC) is between 20 nm and 70 nm, and a higher color gamut can be obtained.

In some embodiments, the light-emitting device is a green light-emitting device. An emission peak of an emission spectrum of the cholesteric liquid crystal layer (CLC) is between $\lambda g-5$ nm and $\lambda g+5$ nm, in which $\lambda g$ is an emission peak of an emission spectrum of the green light-emitting device, that is, $\lambda g$ is between 500 nm and 550 nm. Here, setting the emission peak of the emission spectrum of the cholesteric liquid crystal layer (CLC) between $\lambda g-5$ nm and $\lambda g+5$ nm can approximately characterize that the emission peak of the emission spectrum of the cholesteric liquid crystal layer (CLC) is similar to the emission peak of the emission spectrum of the green light-emitting device, or characterize that the emission spectrum of the cholesteric liquid crystal layer (CLC) is similar to the emission spectrum of the green light-emitting device, so that the light emitted from the second electrode 2 side is finally transmitted from the cholesteric liquid crystal layer (CLC) as much as possible, thereby promoting the effective extraction of light.

A half-peak width of the emission spectrum of the cholesteric liquid crystal layer (CLC) is between 20 nm and 50 nm, which can obtain a higher color gamut.

In some embodiments, the light-emitting device is a blue light-emitting device. An emission peak of an emission spectrum of the cholesteric liquid crystal layer (CLC) is between $\lambda b-2$ nm and $\lambda b+2$ nm, in which $\lambda b$ is an emission peak of an emission spectrum of the blue light-emitting device, that is, $\lambda b$ is between 440 nm and 470 nm. Here, the emission peak of the emission spectrum of the cholesteric liquid crystal layer (CLC) is set between $\lambda g-5$ nm and $\lambda g+5$ nm, which can approximately characterize that the emission peak of the emission spectrum of the cholesteric liquid crystal layer (CLC) is similar to the emission peak of the emission spectrum of the blue light-emitting device, or that the emission spectrum of the cholesteric liquid crystal layer (CLC) is similar to the emission spectrum of the blue light-emitting device, so that the light emitted from the second electrode 2 side is finally transmitted from the cholesteric liquid crystal layer (CLC) as much as possible, thereby promoting the effective extraction of light.

A half-peak width of the emission spectrum of the cholesteric liquid crystal layer (CLC) is between 20 nm and 40 nm, which can obtain a higher color gamut.

Figure 4A:
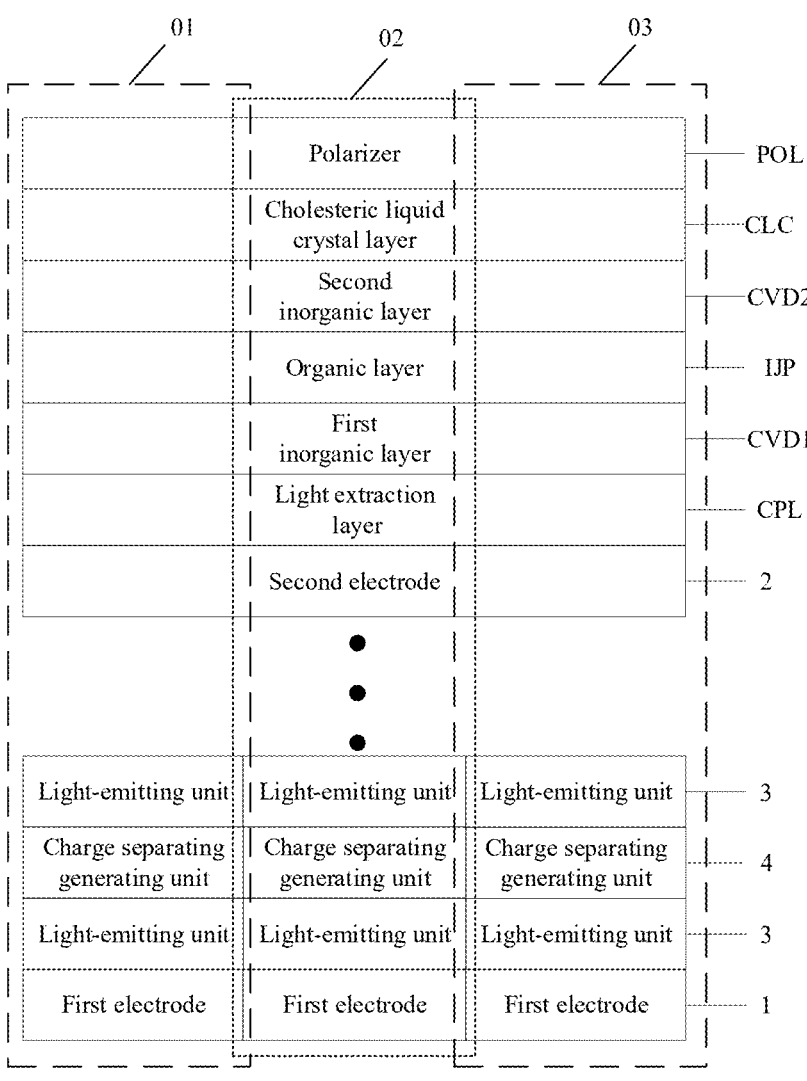
FIG. 4a is a schematic diagram of an exemplary display panel according to an embodiment of the present disclosure.
Figure 4B:
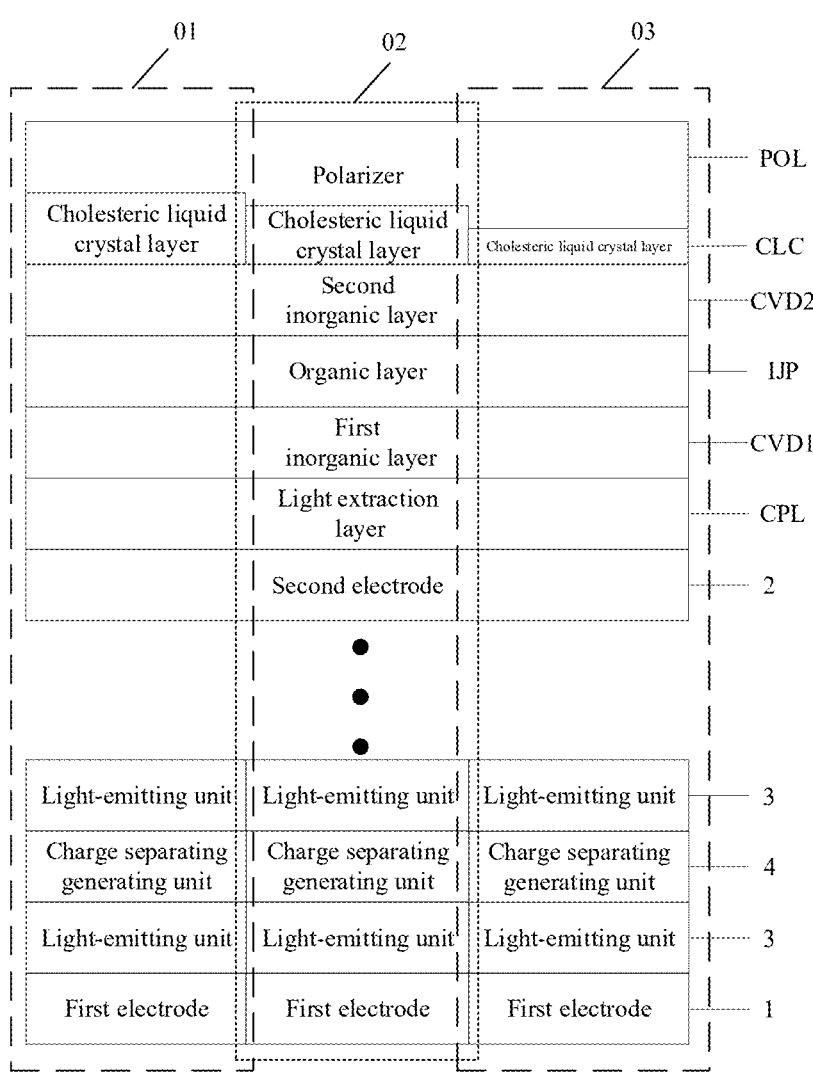
FIG. 4b is a schematic diagram of another exemplary display panel according to an embodiment of the present disclosure.
Figure 4C:
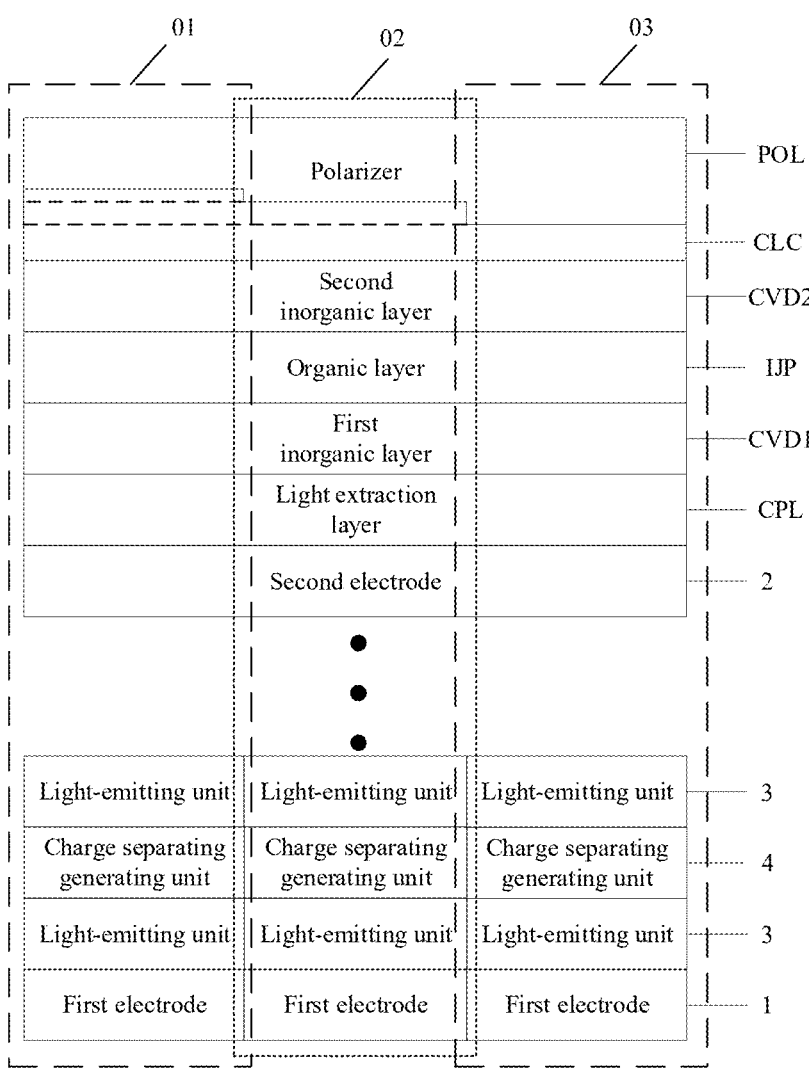
FIG. 4c is a schematic diagram of another exemplary display panel according to an embodiment of the present disclosure.

In some embodiments, as shown in FIG. 4b or FIG. 4c, the light-emitting device is a red light-emitting device 01. A thickness of the cholesteric liquid crystal layer (CLC) is between 2 μm and 8 μm. A distance between two layers of the microscopic spiral structure, i.e., a half pitch P/2 is between 185 nm and 210 nm.

In some embodiments, as shown in FIG. 4b or FIG. 4c, the light-emitting device is a green light-emitting device 02. A thickness of the cholesteric liquid crystal layer (CLC) is between 1 μm and 6 μm. A distance between two layers of the microscopic spiral structure, i.e., a half pitch P/2 is between 155 nm and 185 nm.

In some embodiments, as shown in FIG. 4b or FIG. 4c, the light-emitting device is a blue light-emitting device 03. A thickness of the cholesteric liquid crystal layer (CLC) is between 0.5 μm and 5 μm. A distance between two layers of the microscopic spiral structure, i e., a half pitch P/2 is between 135 nm and 155 nm.

In some embodiments, the light-emitting device is a red light-emitting device, and a transmittance of the second electrode 2 is between 45% and 50%. Alternatively, the light-emitting device is a green light-emitting device, and a transmittance of the second electrode 2 is between 55% and 60%. Alternatively, the light-emitting device is a blue light-emitting device, and a transmittance of the second electrode 2 is between 65% and 70%.

In some embodiments, as shown in FIG. 3, an encapsulation layer 5 is arranged on a side of the cholesteric liquid crystal layer (CLC) close to the second electrode 2. The encapsulation layer 5 includes a first inorganic layer (CVD1) and a second inorganic layer (CVD2), and an organic layer (IJP) arranged between the first inorganic layer (CVD1) and the second inorganic layer (CVD2). A light extraction layer (CPL) is arranged on a side of the encapsulation layer 5 close to the second electrode 2. A refractive index of the second electrode 2 is greater than a refractive index of the light extraction layer (CPL). The refractive index of the light extraction layer (CPL) is less than a refractive index of a first inorganic layer (CVD1). The refractive index of the first inorganic layer (CVD1) is greater than a refractive index of the organic layer (IJP). The refractive index of the organic layer (IJP) is less than a refractive index of the second inorganic layer (CVD2).

Exemplarily, the materials of the first inorganic layer (CVD1) and the second inorganic layer (CVD2) may be selected from inorganic materials such as x silicon oxide SiOx or x silicon oxynitride SiONx. Thicknesses of the first inorganic layer (CVD1) and the second inorganic layer (CVD2) are both between 0.5 μm and 1.2 μm, and refractive indices are between 1.7 and 1.9. A thickness of the organic layer (IJP) is between 8 μm and 15 μm, and a refractive index of the organic layer (IJP) is between 1.4 and 1.6. A thickness of the light extraction layer (CPL) is between 900 Å and 1800 Å, and a refractive index of the light extraction layer (CPL) is between 1.3 and 1.7.

The refractive indices of the light extraction layer (CPL), the first inorganic layer (CVD1), the organic layer (IJP), and the second inorganic layer (CVD2) change alternately, which can fully promote light coupling extraction. The inorganic-organic-inorganic encapsulation layer 5 can effectively prevent the corrosion of water and oxygen in the environment to the interior of the light-emitting device. The light extraction layer (CPL) can effectively extract the outgoing light on the second electrode 2 side while protecting the second electrode 2.

In some embodiments, light-emitting colors of the plurality of light-emitting units 3 are the same. The light-emitting unit 3 includes a light-emitting layer and a sub-functional layer. The sub-functional layer includes at least one of a hole injection layer, a hole transport layer, an electron blocking layer, a hole blocking layer, an electron injection layer, and an electron transport layer.

The guest material of the light-emitting layer can be a fluorescent material, a phosphorescent material or a thermally activated delayed fluorescent material, etc. Exemplarily, the fluorescent materials include DCM (4-dicyanomethyl-2-methyl-6-(p-dimethylaminostyrene) H-pyran), DCJ (4-(dicyanomethyl)-6-methyl-2-(julolidene-9-vinyl)-4H-pyran), Alq3 (tris(8-hydroxyquinoline) aluminum) and DPVPi (4,4'-bis(2,2-styryl)-1,1'-biphenyl), etc. The phosphorescent materials include PtOEP (platinum (II) octaethylporphyrin), FirPic (bis(4,6-difluorophenylpyridine-N,C2) picolinyl iridium), and Ir(ppy)3 (tris (phenylpyridine) iridium complex), etc. The thermally activated delayed fluorescent materials include DACR-DPTX, TPA-DMAC and 4CzIPN (2,4,5,6-tetrakis (9-carbazolyl)-isophthalonitrile).

Exemplarily, the sub-functional layer includes a hole injection layer, a hole transport layer, an electron blocking layer, a hole blocking layer, an electron injection layer, and an electron transport layer. Specifically, the light-emitting unit 3 is provided with a hole injection layer, a hole transport layer, an electron blocking layer, a light-emitting layer, a hole blocking layer, an electron transport layer, and an electron injection layer in sequence in the direction from the anode to the cathode of the light-emitting device.

Exemplarily, the sub-functional layer includes a bole injection layer, a hole transport layer, an electron blocking layer, a hole blocking layer, an electron injection layer, and an electron transport layer. Specifically, the light-emitting unit 3 is provided with a hole injection layer, a hole transport layer, an electron blocking layer, a light-emitting layer, an electron transport layer, and an electron injection layer in sequence in the direction from the anode to the cathode of the light-emitting device.

Exemplarily, the tandem light-emitting device includes two light-emitting units 3, which are sequentially in the direction from the anode to the cathode provided with: a first hole injection layer, a first hole transport layer, a first electron blocking layer, a first light-emitting layer, a first electron transport layer, a first electron injection layer, a charge separating generating unit 4, a second hole injection layer, a second hole transport layer, a second electron blocking layer, a second light-emitting layer, a second electron transport layer, and a second electron injection layer.

As mentioned above, the material of the hole injection layer may be molybdenum trioxide $MoO_3$. The material of the hole transport layer may be NPB (N,N'-diphenyl-N,N'-(1-naphthyl)-1,1'-biphenyl-4,4'-diamine). The material of the electron blocking layer may be TCTA (4,4',4''-tri (carbazole-9-yl)triphenylamine). The material of the electron transport layer may be TPBi (1,3,5-tri (1-phenyl-1H-benzimidazol-2-yl)benzene). The material of the electron injection layer may be lithium fluoride LiF.

In some implementations, the charge separating generating unit 4 includes an N-type doped charge generating layer (N-CGL) and a P-type doped charge generating layer (P-CGL). The materials of N-CGL/P-CGL may be inorganic/inorganic, such as lithium Li/calcium Ca/silver Ag, LiF/aluminum Al/gold Au, aluminum Al/tungsten trioxide $WO_3$/gold Au and other materials, among which Li/Ca belongs to the materials of N-CGL and Ag belongs to the materials of P-CGL; or inorganic/organic, such as Alq3 (Bphen (4,7-diphenyl-1,10-phenanthroline) or BCP (basic calcium phosphate):Li, Bphen:Rb2CO3 (rubidium carbonate) and LiF/ZnPc (zinc phthalocyanine): carbon C60/MoO3 (molybdenum trioxide), etc.; or organic/organic, such as Alq3:Li(Bphen:Li)/HAT-CN, F16CuPc (perfluorocopper phthalocyanine)/CuPc (tetrasulfonic acid copper phthalocyanine) and Li:Bphen/Al/F4-TCNQ (2,3,5,6-tetrafluoro-7,7',8,8'-tetracyanodimethyl-p-benzoquinone)/HAT-CN. For "Li:Bphen/Al/F4-TCNQ/HAT-CN", Li:Bphen/Al belongs to the material of N-CGL, and F4-TCNQ/HAT-CN belongs to the material of P-CGL.

It should be noted that, here ":" represents doping. For example, Alq3:Li represents doping Li into Alq3.

In some embodiments, the main material of the light-emitting layer in the red light-emitting device may be selected from the phosphorescent material TCTA, and the guest material may be selected from the red phosphorescent material Ir(piq)2acac (tris [1-phenylisoquinoline-C2,N] iridium (III)). The material of the charge separating generating unit 4 is HAT-CN, and is doped with Al, and Al and HAT-CN work together to improve the charge generation efficiency. The tandem red light-emitting device includes a substrate, a first electrode 1 and a second electrode 2 arranged on the substrate, a plurality of light-emitting units 3 arranged between the first electrode 1 and the second electrode 2, and a charge separating generating unit 4 arranged between adjacent light-emitting units 3; a first hole injection layer, a first hole transport layer, a first electron blocking layer, a first light-emitting layer, a first electron transport layer, a first electron injection layer, a charge separating generating unit 4, a second hole injection layer, a second hole transport layer, a second electron blocking layer, a second light-emitting layer, a second electron transport layer, and a second electron injection layer sequentially arranged in the direction from the anode to the cathode.

Example 1: The first electrode 1 is a cathode, and the second electrode 2 is an anode. Combined with the microcavity structure of the above-mentioned red light-emitting device, a photoelectric testing system is used to test the driving voltage, current efficiency and power efficiency of the red light-emitting device. The specific test results are shown in Table 1.

Example 2: The first electrode 1 is an anode, and the second electrode 2 is a cathode. In combination with the microcavity structure of the above-mentioned red light-emitting device, a photoelectric testing system is used to test the driving voltage, current efficiency and power efficiency of the red light-emitting device. The specific test results are shown in Table 1.

Example 3: The first electrode 1 is a cathode, the second electrode 2 is an anode. Combined with the microcavity structure of the above-mentioned red light-emitting device and the cholesteric liquid crystal layer (CLC), a photoelectric testing system is used to test the driving voltage, current efficiency and power efficiency of the red light-emitting device. The specific test results are shown in Table 1.

Example 4: The first electrode 1 is an anode, and the second electrode 2 is a cathode. Combined with the microcavity structure of the above-mentioned red light-emitting device and the cholesteric liquid crystal layer (CLC), a photoelectric testing system is used to test the driving voltage, current efficiency and power efficiency of the red light-emitting device. The specific test results are shown in Table 1.

Table 1 shows the electro-optical parameters of the red light-emitting device according to the embodiments of the present disclosure in the examples, including the driving voltage, current efficiency and power efficiency of the red light-emitting device, as shown in Table 1:

TABLE 1

|  | Driving voltage | Current efficiency | Power efficiency |
|---|---|---|---|
| Example 1 | 100% | 100% | 100% |
| Example 2 | 105% | 245% | 230% |
| Example 3 | 100% | 200% | 160% |
| Example 4 | 105% | 385% | 320% |

It can be seen from the parameters in Table 1 that the electro-optical performance of the tandem red light-emitting device with the first electrode 1 as the anode and the second electrode 2 as the cathode is the best. The synergistic effect of the microcavity effect inside the tandem red light-emitting device and the optical gain of the cholesteric liquid crystal layer (CLC) fully realizes the significant enhancement of the electro-optical performance of the entire tandem red OLED device.

In some embodiments, the main material of the light-emitting layer in the green light-emitting device may be selected from the phosphorescent material TCTA, and the guest material may be selected from the phosphorescent material Ir(ppy)3. The material of the charge separating generating unit 4 is HAT-CN, and is doped with Al, and Al and HAT-CN work together to improve the charge generation efficiency. The tandem green light-emitting device includes a substrate, a first electrode 1 and a second electrode 2 arranged on the substrate, a plurality of light-emitting units 3 arranged between the first electrode 1 and the second electrode 2, and a charge separating generating unit 4 arranged between adjacent light-emitting units 3; a first hole injection layer, a first hole transport layer, a first electron blocking layer, a first light-emitting layer, a first electron transport layer, a first electron injection layer, a charge separating generating unit 4, a second hole injection layer, a second hole transport layer, a second electron blocking layer, a second light-emitting layer, a second electron transport layer, and a second electron injection layer sequentially arranged in the direction from the anode to the cathode.

Example 5: The first electrode 1 is a cathode, the second electrode 2 is an anode. Combined with the microcavity structure of the green light-emitting device, a photoelectric testing system is used to test the driving voltage, current efficiency and power efficiency of the green light-emitting device. The specific test results are shown in Table 2.

Example 6: The first electrode 1 is an anode, the second electrode 2 is a cathode. Combined with the microcavity structure of the green light-emitting device, a photoelectric testing system is used to test the driving voltage, current efficiency and power efficiency of the green light-emitting device. The specific test results are shown in Table 2.

Example 7: The first electrode 1 is a cathode, the second electrode 2 is an anode. Combined with the microcavity structure of the green light-emitting device and the cholesteric liquid crystal layer (CLC), a photoelectric testing system is used to test the driving voltage, current efficiency and power efficiency of the green light-emitting device. The specific test results are shown in Table 2.

Example 8: The first electrode 1 is an anode, the second electrode 2 is a cathode. Combined with the microcavity structure of the green light-emitting device and the cholesteric liquid crystal layer (CLC), a photoelectric testing system is used to test the driving voltage, current efficiency and power efficiency of the green light-emitting device. The specific test results are shown in Table 2.

Table 2 shows the electro-optical parameters of the green light-emitting device according to the embodiment of the present disclosure in the examples, including the driving voltage, current efficiency and power efficiency of the green light-emitting device, as shown in Table 2:

TABLE 2

|  | Driving voltage | Current efficiency | Power efficiency |
| --- | --- | --- | --- |
| Example 5 | 100% | 100% | 100% |
| Example 6 | 103% | 280% | 260% |
| Example 7 | 100% | 240% | 220% |
| Example 8 | 103% | 450% | 410% |

It can be seen from the parameters in Table 2 that the electro-optical performance of the tandem green light-emitting device with the first electrode 1 as the anode and the second electrode 2 as the cathode is the best. The synergistic effect of the microcavity effect inside the tandem green light-emitting device and the optical gain of the cholesteric liquid crystal layer (CLC) fully realizes the significant enhancement of the electro-optical performance of the entire tandem green OLED device.

In some embodiments, the main material of the light-emitting layer in the blue light-emitting device may be selected from the phosphorescent material TCTA, and the guest material may be selected from the phosphorescent material FIrpic. The material of the charge separating generating unit 4 is HAT-CN, and is doped with Al, and Al and HAT-CN work together to improve the charge generation efficiency. The tandem blue light-emitting device includes a substrate, a first electrode 1 and a second electrode 2 arranged on the substrate, a plurality of light-emitting units 3 arranged between the first electrode 1 and the second electrode 2, and a charge separating generating unit 4 arranged between adjacent light-emitting units 3; a first hole injection layer, a first hole transport layer, a first electron blocking layer, a first light-emitting layer, a first electron transport layer, a first electron injection layer, a charge separating generating unit 4, a second hole injection layer, a second hole transport layer, a second electron blocking layer, a second light-emitting layer, a second electron transport layer, and a second electron injection layer sequentially arranged in the direction from the anode to the cathode.

Example 5: The first electrode 1 is a cathode, the second electrode 2 is an anode. Combined with the microcavity structure of the above-mentioned blue light-emitting device, a photoelectric testing system is used to test the driving voltage, current efficiency and power efficiency of the blue light-emitting device. The specific test results are shown in Table 3.

Example 6: The first electrode 1 is an anode, the second electrode 2 is a cathode. Combined with the microcavity structure of the above-mentioned blue light-emitting device, a photoelectric testing system is used to test the driving voltage, current efficiency and power efficiency of the blue light-emitting device. The specific test results are shown in Table 3.

Example 7: The first electrode 1 is a cathode, the second electrode 2 is an anode. Combined with the microcavity structure of the above-mentioned blue light-emitting device and the cholesteric liquid crystal layer (CLC), a photoelectric testing system is used to test the driving voltage, current efficiency and power efficiency of the blue light-emitting device. The specific test results are shown in Table 3.

Example 8: The first electrode 1 is an anode, the second electrode 2 is a cathode. Combined with the microcavity structure of the above-mentioned blue light-emitting device and the cholesteric liquid crystal layer (CLC), a photoelectric testing system is used to test the driving voltage, current efficiency and power efficiency of the blue light-emitting device. The specific test results are shown in Table 3.

Table 3 shows the electro-optical parameters of the blue light-emitting device according to the embodiment of the present disclosure in the examples, including the driving voltage, current efficiency and power efficiency of the blue light-emitting device, as shown in Table 3:

TABLE 3

|  | Driving voltage | Current efficiency | Power efficiency |
| --- | --- | --- | --- |
| Example 5 | 100% | 100% | 100% |
| Example 6 | 102% | 200% | 180% |
| Example 7 | 100% | 160% | 130% |
| Example 8 | 102% | 290% | 230% |

It can be seen from the parameters in Table 3 that the electro-optical performance of the tandem blue light-emitting device with the first electrode 1 as the anode and the second electrode 2 as the cathode is the best. The synergistic effect of the microcavity effect inside the tandem blue light-emitting device and the optical gain of the cholesteric liquid crystal layer (CLC) fully realizes the significant enhancement of the electro-optical performance of the entire tandem blue OLED device.

An embodiment of the present disclosure also provides a display panel, which includes the light-emitting device of any one of the above embodiments. The display panel according to the embodiment of the present disclosure has great advantages and can be applied to products with small and medium-sized display panels, such as mobile phones, tablet computers, vehicle-mounted devices, wearable devices, etc. Since the tandem light-emitting devices in the display panel improve the power efficiency and current efficiency and reduce the operating voltage compared with the traditional tandem light-emitting devices, the display effect of the tandem light-emitting devices on the display panel can be better optimized, such as luminous brightness, color, etc.

In some embodiments, the display panel includes three light-emitting devices with different light emitting colors, for example, a red light-emitting device 01, a green light-emitting device 02, and a blue light-emitting device 03.

In some embodiments, FIG. 4a is a schematic diagram of an exemplary display panel according to an embodiment of the present disclosure. As shown in FIG. 4a, the thicknesses of the cholesteric liquid crystal layers (CLCs) in the light-emitting devices of different light-emitting colors can be the same, and in the process preparation flow, an integrally formed cholesteric liquid crystal layer (CLC) film is formed. Exemplarily, the thickness of the cholesteric liquid crystal layer (CLC) is between 2 μm and 5 μm.

Here is a patterned cholesteric liquid crystal layer (CLC), and the thin films of the cholesteric liquid crystal layers (CLCs) in light-emitting devices of different colors are the same. which is convenient for the process preparation of the light-emitting device.

In some embodiments, FIG. 4b is a schematic diagram of another exemplary display panel according to an embodiment of the present disclosure. As shown in FIG. 4b, the thicknesses of the cholesteric liquid crystal layers (CLCs) in light-emitting devices of different luminous colors are different. In the process preparation flow, three patterned cholesteric liquid crystal layers (CLCs) can be formed. Exemplarily, the light-emitting device is a red light-emitting device 01; and the thickness of the cholesteric liquid crystal layer (CLC) is between 2 μm and 8 μm. The light-emitting device is a green light-emitting device 02; and the thickness of the cholesteric liquid crystal layer (CLC) is between 1 μm and 6 μm. The light-emitting device is a blue light-emitting device 03; and the thickness of the cholesteric liquid crystal layer (CLC) is between 0.5 μm and 5 μm.

In some embodiments, FIG. 4c is a schematic diagram of another exemplary display panel according to an embodiment of the present disclosure. As shown in FIG. 4c, the thicknesses of the cholesteric liquid crystal layers (CLCs) in the light-emitting devices of different luminous colors are different. In the process preparation flow, three stacked cholesteric liquid crystal layers (CLCs) are sequentially formed on the side of the second inorganic layer (CVD2) away from the organic layer (IJP). The dotted line in FIG. 4c indicates the boundary of the formation of different layers of cholesteric liquid crystal layer (CLC) films, and the film thicknesses of the cholesteric liquid crystal layers (CLCs) in the light-emitting devices of different colors are different. Exemplarily, the light-emitting device is a red light-emitting device 01; and the thickness of the cholesteric liquid crystal layer (CLC) is between 2 μm and 8 μm. The light-emitting device is a green light-emitting device 02; and the thickness of the cholesteric liquid crystal layer (CLC) is between 1 μm and 6 μm. The light-emitting device is a blue light-emitting device 03; and the thickness of the cholesteric liquid crystal layer (CLC) is between 0.5 μm and 5 μm.

As mentioned above, different thicknesses of the cholesteric liquid crystal layer (CLC) are set for light-emitting devices with different luminous colors, so that the emission peak of the emission spectrum of the cholesteric liquid crystal layer (CLC) is as close as possible to the emission peak of the emission spectrum of the light-emitting device, thereby promoting effective extraction of light and significantly enhancing the performance of the display panel.

It can be understood that the above embodiments are only exemplary embodiments adopted to illustrate the principles of the present disclosure, but the present disclosure is not limited thereto. For those of ordinary skill in the art, various modifications and improvements can be made without departing from the spirit and essence of the disclosure, and these modifications and improvements are also regarded as the protection scope of the disclosure.

The invention claimed is:

1. A light-emitting device, comprising a first electrode, a second electrode, a plurality of light-emitting units arranged between the first electrode and the second electrode and connected in series, a charge separating generating unit arranged between adjacent light-emitting units, a cholesteric liquid crystal layer arranged on a side of the second electrode away from the first electrode, and a polarizer arranged on a side of the cholesteric liquid crystal layer away from the second electrode, wherein a light-emitting center of the light-emitting unit is located at an antinode point of a resonance wave of a resonant microcavity formed between the first electrode and the second electrode, a transmission rotation direction of the polarizer is set opposite to a reflection rotation direction of the cholesteric liquid crystal layer, and a distance between light-emitting centers of two adjacent light emitting units is the same as a distance between two adjacent antinode points of the resonance wave.

2. The light-emitting device according to claim 1, wherein a cavity length of the resonant microcavity formed between the first electrode and the second electrode is k/2 times a wavelength of emitted light of the light-emitting device, where k is an integer.

3. The light-emitting device according to claim 2, wherein the plurality of light-emitting units comprises two light-emitting units, which are referred to as a first light-emitting unit and a second light-emitting unit; and
   a distance from a light-emitting center of the first light-emitting unit to a side of the first electrode close to the second electrode is $(2u+1)/4$ times the wavelength of the emitted light of the light-emitting device, and a distance from a light-emitting center of the second light-emitting unit to the side of the first electrode close to the second electrode is $(2v+1)/4$ times the wavelength of the emitted light of the light-emitting device, where both u and v are integers, u is less than v, and both u and v are less than k−0.5.

4. The light-emitting device according to claim 1, wherein the light-emitting device comprises a red light-emitting device; and
   an emission peak of an emission spectrum of the red light-emitting device is between 610 nm and 690 nm;

and a half-peak width of the emission spectrum of the red light-emitting device is between 20 nm and 50 nm.

5. The light-emitting device according to claim 1, wherein the light-emitting device comprises a green light-emitting device; and an emission peak of an emission spectrum of the green light-emitting device is between 500 nm and 550 nm; and a half-peak width of the emission spectrum of the green light-emitting device is between 15 nm and 35 nm.

6. The light-emitting device according to claim 1, wherein the light-emitting device comprises a blue light-emitting device; and an emission peak of an emission spectrum of the blue light-emitting device is between 440 nm and 470 nm; and a half-peak width of the emission spectrum of the blue light-emitting device is between 10 nm and 25 nm.

7. The light-emitting device according to claim 1, wherein the light-emitting device comprises a red light-emitting device; and an emission peak of an emission spectrum of the cholesteric liquid crystal layer is between $\lambda r-8$ nm and $\lambda r+8$ nm, wherein $\lambda r$ is an emission peak of an emission spectrum of the red light-emitting device; and a half-peak width of the emission spectrum of the cholesteric liquid crystal layer is between 20 nm and 70 nm.

8. The light-emitting device according to claim 1, wherein the light-emitting device comprises a green light-emitting device; and an emission peak of an emission spectrum of the cholesteric liquid crystal layer is between $\lambda g-5$ nm and $\lambda g+5$ nm, wherein $\lambda g$ is an emission peak of an emission spectrum of the green light-emitting device; and a half-peak width of the emission spectrum of the cholesteric liquid crystal layer is between 20 nm and 50 nm.

9. The light-emitting device according to claim 1, wherein the light-emitting device comprises a blue light-emitting device; and an emission peak of an emission spectrum of the cholesteric liquid crystal layer is between $\lambda b-2$ nm and $\lambda b+2$ nm, wherein $\lambda b$ is an emission peak of an emission spectrum of the blue light-emitting device; and a half-peak width of the emission spectrum of the cholesteric liquid crystal layer is between 20 nm and 40 nm.

10. The light-emitting device according to claim 1, wherein the light-emitting device comprises at least one of:

a red light-emitting device, a transmittance of the second electrode in the red light-emitting device being between 45% and 50%;

a green light-emitting device, a transmittance of the second electrode in the green light-emitting device being between 55% and 60%; and a blue light-emitting device, a transmittance of the second electrode in the blue light-emitting device being between 65% and 70%.

11. The light-emitting device according to claim 1, wherein an encapsulation layer is arranged on a side of the cholesteric liquid crystal layer close to the second electrode; and the encapsulation layer comprises a first inorganic layer and a second inorganic layer, and an organic layer arranged between the first inorganic layer and the second inorganic layer;

a light extraction layer is arranged on a side of the encapsulation layer close to the second electrode; and a refractive index of the second electrode is greater than a refractive index of the light extraction layer; the refractive index of the light extraction layer is less than a refractive index of the first inorganic layer; the refractive index of the first inorganic layer is greater than a refractive index of the organic layer; and the refractive index of the organic layer is less than a refractive index of the second inorganic layer.

12. A display panel, comprising at least one light-emitting device which comprises: a first electrode, a second electrode, a plurality of light-emitting units arranged between the first electrode and the second electrode and connected in series, a charge separating generating unit arranged between adjacent light-emitting units, a cholesteric liquid crystal layer arranged on a side of the second electrode away from the first electrode, and a polarizer arranged on a side of the cholesteric liquid crystal layer away from the second electrode, wherein a light-emitting center of the light-emitting unit is located at an antinode point of a resonance wave of a resonant microcavity formed between the first electrode and the second electrode, a transmission rotation direction of the polarizer is set opposite to a reflection rotation direction of the cholesteric liquid crystal layer, and a distance between light-emitting centers of two adjacent light emitting units is the same as a distance between two adjacent antinode points of the resonance wave.

13. The display panel according to claim 12, wherein a cavity length of the resonant microcavity formed between the first electrode and the second electrode is k/2 times a wavelength of emitted light of the light-emitting device, where k is an integer.

14. The display panel according to claim 13, wherein the plurality of light-emitting units comprises two light-emitting units, which are referred to as a first light-emitting unit and a second light-emitting unit; and a distance from a light-emitting center of the first light-emitting unit to a side of the first electrode close to the second electrode is $(2u+1)/4$ times the wavelength of the emitted light of the light-emitting device, and a distance from a light-emitting center of the second light-emitting unit to the side of the first electrode close to the second electrode is $(2v+1)/4$ times the wavelength of the emitted light of the light-emitting device, where both u and v are integers, u is less than v, and both u and v are less than k−0.5.

*    *    *    *    *